(12) United States Patent
Chang et al.

(10) Patent No.: US 9,419,072 B2
(45) Date of Patent: Aug. 16, 2016

(54) SEMICONDUCTOR DEVICE AND METHOD FOR FABRICATING THE SAME

(71) Applicant: Samsung Electronics Co., Ltd., Suwon-si (KR)

(72) Inventors: Chongkwang Chang, Incheon (KR); Youngjoon Moon, Seoul (KR); Duck-nam Kim, Seoul (KR); Yeong-Jong Jeong, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 134 days.

(21) Appl. No.: 13/915,284

(22) Filed: Jun. 11, 2013

(65) Prior Publication Data

US 2013/0270569 A1    Oct. 17, 2013

Related U.S. Application Data

(63) Continuation of application No. 12/871,044, filed on Aug. 30, 2010, now Pat. No. 8,466,023.

(30) Foreign Application Priority Data

Oct. 19, 2009  (KR) ........................ 10-2009-0099364

(51) Int. Cl.
*H01L 21/336* (2006.01)
*H01L 29/04* (2006.01)
*H01L 21/28* (2006.01)
*H01L 21/3213* (2006.01)
(Continued)

(52) U.S. Cl.
CPC .......... *H01L 29/04* (2013.01); *H01L 21/28247* (2013.01); *H01L 21/32137* (2013.01); *H01L 21/32138* (2013.01); *H01L 21/823842* (2013.01); *H01L 21/823857* (2013.01); *H01L 29/4966* (2013.01)

(58) Field of Classification Search
CPC .................. H01L 21/32137; H01L 21/823842
See application file for complete search history.

(56) References Cited

U.S. PATENT DOCUMENTS 5,434,093 A * 7/1995 Chau et al. .................... 438/300
5,783,478 A * 7/1998 Chau et al. .................... 438/592
6,316,323 B1 * 11/2001 Fang et al. .................... 438/305

(Continued)

FOREIGN PATENT DOCUMENTS

JP     2005175171     6/2005
JP     2007-123890    5/2007

(Continued)

OTHER PUBLICATIONS

"Semiconductor Device and Method for Fabricating the Same" Specification, Drawings, and Prosecution History, of U.S. Appl. No. 12/871,044, filed Aug. 30, 2010, by Chongkwang Chang, et al.

(Continued)

*Primary Examiner* — Mark Tornow
(74) *Attorney, Agent, or Firm* — Onello & Mello, LLP

(57) ABSTRACT

A semiconductor device and a method of fabricating the same include a semiconductor substrate, a high-k dielectric pattern and a metal-containing pattern sequentially being stacked on the semiconductor substrate, a gate pattern including poly semiconductor and disposed on the metal-containing pattern, and a protective layer disposed on the gate pattern, wherein the protective layer includes oxide, nitride and/or oxynitride of the poly semiconductor.

12 Claims, 9 Drawing Sheets

(51) Int. Cl.
*H01L 21/8238* (2006.01)
*H01L 29/49* (2006.01)

(56) References Cited

U.S. PATENT DOCUMENTS

| | | | |
|---|---|---|---|
| 6,344,397 B1 * | 2/2002 | Horstmann et al. | 438/300 |
| 6,482,691 B2 * | 11/2002 | Wu et al. | 438/217 |
| 7,208,424 B2 | 4/2007 | Stephens et al. | |
| 7,361,561 B2 | 4/2008 | Goolsby et al. | |
| 2002/0151183 A1 | 10/2002 | Yang et al. | |
| 2004/0033655 A1 | 2/2004 | Chuang et al. | |
| 2004/0203209 A1 | 10/2004 | Bicksler et al. | |
| 2006/0011949 A1 | 1/2006 | Yang et al. | |
| 2006/0063364 A1 | 3/2006 | Stephens et al. | |
| 2006/0148146 A1 | 7/2006 | Lee | |
| 2006/0205159 A1 | 9/2006 | Park | |
| 2006/0292773 A1 * | 12/2006 | Goolsby et al. | 438/197 |
| 2007/0099428 A1 | 5/2007 | Shamiryan et al. | |
| 2007/0202700 A1 | 8/2007 | Leucke et al. | |
| 2008/0203447 A1 | 8/2008 | Arnold et al. | |
| 2008/0203488 A1 | 8/2008 | Chung et al. | |
| 2008/0206947 A1 | 8/2008 | Suzuki | |
| 2011/0092040 A1 | 4/2011 | Chang et al. | |

FOREIGN PATENT DOCUMENTS

| | | |
|---|---|---|
| JP | 2007235135 | 9/2007 |
| JP | 2008514001 | 5/2008 |
| JP | 2008-219006 | 9/2008 |
| JP | 200994106 | 4/2009 |
| KR | 2006077643 | 7/2006 |
| KR | 10-0868768 | 11/2008 |

OTHER PUBLICATIONS

Japan Office Action dated Sep. 16, 2014, issued in corresponding Japan Application No. 2010-223671.

* cited by examiner

SEMICONDUCTOR DEVICE AND METHOD FOR FABRICATING THE SAME

CROSS-REFERENCE TO RELATED APPLICATIONS

This application is a continuation application of U.S. patent application Ser. No. 12/871,044, filed on Aug. 30, 2010, which claims the benefit of Korean Patent Application No. 10-2009-0099364, filed in the Korean Intellectual Property Office on Oct. 19, 2009, the entire contents of which application are incorporated herein in their entirety by reference.

BACKGROUND

1. Field

The present inventive concept relates to a semiconductor device and method for fabricating the same, and more particularly, to a semiconductor device having a semiconductor layer and a metal-containing layer and a method for fabricating the same.

2. Description of the Related Art

As the integration density of semiconductor devices is increased, sizes of components in the semiconductor devices become minimized. However, conventional devices are limited in the extent to which components can be minimized. For example, in a patterning process for forming patterns of narrow width, device characteristics may not be maintained even if the pattern of narrow width is only slightly damaged.

SUMMARY

According to one aspect, the inventive concept is directed to a method of fabricating a semiconductor device including: forming a high-k dielectric layer on a semiconductor substrate; forming a metal-containing layer on the high-k dielectric layer; forming a semiconductor layer including poly semiconductor on the metal-containing layer; anisotropically etching the semiconductor layer; providing reactive nitrogen and/or oxygen-containing gas to the semiconductor layer and an adjacent region to the semiconductor layer; and anisotropically etching the metal-containing layer and the high-k dielectric layer.

In some embodiments, a portion of the poly semiconductor is separated from the semiconductor layer by the anisotropic etching, and the separated poly semiconductor is nitrified and/or oxidized by the reactive nitrogen and/or oxygen-containing gas to form protective particles.

In some embodiments, the protective particles are attached on a sidewall of the semiconductor layer to form a protective layer.

In some embodiments, the protective particles have different etching selectivity from the semiconductor layer.

In some embodiments, the metal-containing layer is etched using the protective layer and the etched semiconductor layer as an etch mask.

In some embodiments, the semiconductor substrate includes a first region and a second region which include dopants of different conductivity, wherein the high-k dielectric layer, the metal-containing layer and the semiconductor layer may be formed on the first region and the second region of the semiconductor substrate, and a gate conductive layer is formed between the metal-containing layer and the high-k dielectric layer on the second region.

In some embodiments, the gate conductive layer includes a plurality of conductive metal compound layers, and an insulating thin film is interposed between the conductive metal compound layers.

In some embodiments, the etching of the semiconductor layer includes: etching an upper portion of the semiconductor layer; and etching a lower portion of the semiconductor layer. The providing of reactive nitrogen and/or oxygen-containing gas is performed between the etching of the upper portion of the semiconductor layer and the etching of the lower portion of the semiconductor layer.

In some embodiments, the etching of the semiconductor layer and the providing of the reactive nitrogen and/or oxygen-containing gas are alternately conducted several times.

In some embodiments, etching byproducts of the metal-containing layer are nitrified and/or oxidized by the reactive nitrogen and/or oxygen-containing gas.

According to another aspect, the inventive concept is directed to a semiconductor device which includes: a semiconductor substrate; a high-k dielectric pattern and a metal-containing pattern sequentially stacked on the semiconductor substrate; a gate pattern including poly semiconductor disposed on the metal-containing pattern; and a protective layer disposed on the gate pattern, wherein the protective layer includes oxide, nitride and/or oxynitride of the poly semiconductor.

In some embodiments, the protective layer may cover at least a portion of a sidewall of the gate pattern.

In some embodiments, the protective layer includes oxidized and/or nitrified particles of the poly semiconductor.

In some embodiments, the particles of the poly semiconductor are disposed non-uniformly on the sidewall of the gate pattern.

In some embodiments, the protective layer has non-uniform thickness.

In some embodiments, the semiconductor substrate includes a first region and a second region; and the high-k dielectric layer pattern, the metal-containing pattern and the gate pattern are disposed on the first region and the second region, wherein the device further includes a gate conductive pattern selectively interposed between the high-k dielectric pattern and the metal-containing pattern on the second region.

In some embodiments, the first and second regions of the semiconductor substrate include a first well region of a first conductivity and a second well region of a second conductivity, respectively.

In some embodiments, the protective layer further includes nitride, oxide and/or oxynitride of etching byproducts of the metal-containing layer.

In some embodiments, at least a portion of the sidewall of the gate pattern is at an obtuse angle with respect to the bottom of the gate pattern.

In some embodiments, the metal-containing layer at an edge of the gate pattern is depressed.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Exemplary embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this description will be thorough and complete, and will fully convey the scope of the inventive concept to those skilled in the art.

Hereinafter, exemplary embodiments of the inventive concept will be described in detail with reference to the accompanying drawings.

Figure 1A:
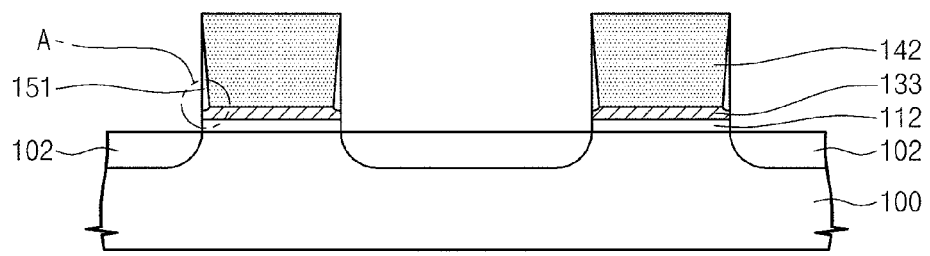
FIG. 1A is a view illustrating a semiconductor device according to an embodiment of the inventive concept.
Figure 1B:
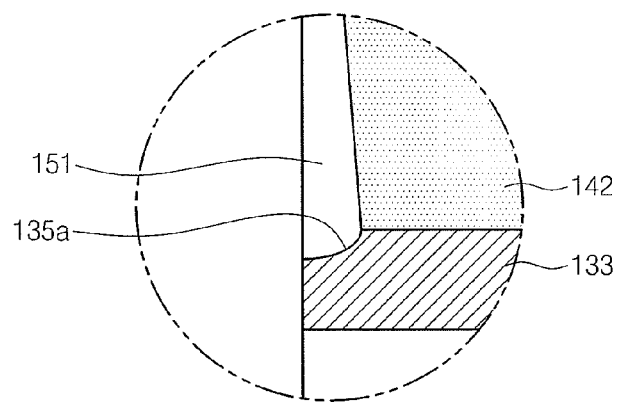
FIG. 1B is an expansion view of the A region in FIG. 1A.

FIG. 1A is a view illustrating a semiconductor device according to an embodiment of the inventive concept, and FIG. 1B is an expansion view of the A region in FIG. 1A.

Referring to FIGS. 1A and 1B, a semiconductor substrate 100 is provided. The semiconductor substrate 100 may include a well region (not shown) where dopants of a first conductivity type are doped. Source/drain regions 102 may be disposed in the semiconductor substrate 100. The source/drain regions 102 may be doped with dopants of a second conductivity type opposite to the first conductivity type.

A gate insulating pattern 112, a metal-containing pattern 133 and a gate pattern 142 may be sequentially stacked on the semiconductor substrate 100 between the source/drain regions 102.

The gate insulating pattern 112 may include insulating material which has higher dielectric constant than that of silicon dioxide ($SiO_2$). Thus the gate insulating pattern 112 may be a high-k dielectric layer. The gate insulating pattern 112 may include metal oxide, metal silicon oxide or metal silicon oxynitride containing at least one of Hafnium, Zirconium, Aluminum, Titanium, Lanthanum, Yttrium, Gadolinium and Tantalum. For example, the gate insulating pattern 112 may include hafnium silicon oxynitride (HfSiON).

The metal-containing pattern 133 may be disposed on the gate insulating pattern 112 and have a sidewall coplanar with a portion of the sidewall of the gate insulating pattern 112. An edge portion 135a of the upper surface of the metal-containing pattern may be depressed. Thus the edge portion 135a of the metal-containing pattern 133 may be lower than center of the metal-containing pattern 133.

The metal-containing pattern 133 may include a conductive metal compound. For example, the metal-containing pattern 133 may include metal nitride. The metal-containing pattern 133 may include metal nitride containing at least one selected from a group consisting of Titanium, Tantalum, Tungsten, Molybdenum, Aluminum, Hafnium and Zirconium.

The gate pattern 142 may include a semiconductor doped with dopants. The gate pattern 142 may include poly semiconductor that is doped with n-conductivity type or p-conductivity type dopants. For example, the gate pattern 142 may include poly semiconductor. The highest part of the gate pattern 142 may be wider than the lowest part of the gate pattern 142. For example, the gate pattern 142 may have tapered width. Thus at least a portion of a sidewall of the gate pattern 142 may be at an obtuse angle with respect to the bottom surface of the gate pattern 142.

A protective layer 151 may be disposed on the sidewall of the gate pattern 142. The protective layer 151 may be disposed on the edge portion 135a of the metal-containing pattern. Alternatively, the edge portion 135a of the metal-containing pattern may not be depressed so that the protective layer 151 is disposed on the edge portion 135 which is not depressed.

The protective layer 151 may include a plurality of protective particles which are attached non-uniformly on the gate pattern 142. The protective particles may have non-uniform thickness. In the embodiment of the inventive concept, a lower part of the protective layer 151 may include more protective particles than an upper part of the protective layer 151. Therefore, the lower part of the protective layer 151 may be thicker than the upper part. The protective particles are attached non-uniformly on the sidewall of the gate pattern 142.

The protective layer 151 may have non-uniform thickness depending on the number of the protective particles. However, the thickness of the protective layer 151 may be varied in accordance with arrangement of the protective particles.

The protective particles of the protective layer 151 may include oxide, nitride and/or oxynitride that include material of the gate pattern 142. For example, the protective particles may include oxide, nitride and/or oxynitride of poly semiconductors. In the embodiment of the inventive concept, the protective particles may include semiconductor particles of which surfaces are oxidized or nitrified. The protective layer 151 may protect the sidewall of the gate pattern 142.

In addition, the protective layer 151 may further include oxide, nitride and/or oxynitride that include material of the gate pattern 142. For example, the protective layer may further include oxide, nitride and/or oxynitride of one selected from Titanium, Tantalum, Tungsten, Molybdenum, Aluminum, Hafnium and Zirconium.

Figure 2A:
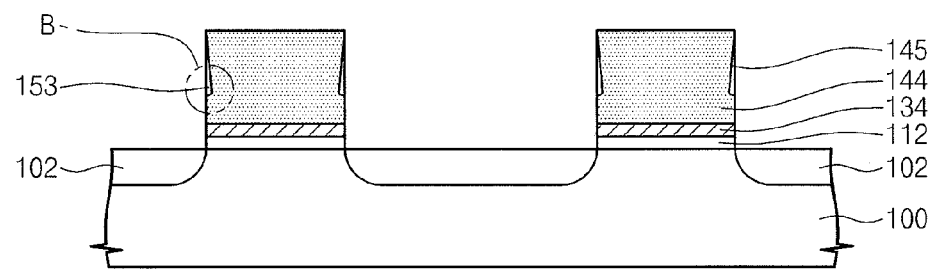
FIG. 2A is a view illustrating a semiconductor device according to a modified embodiment of the inventive concept.
Figure 2B:
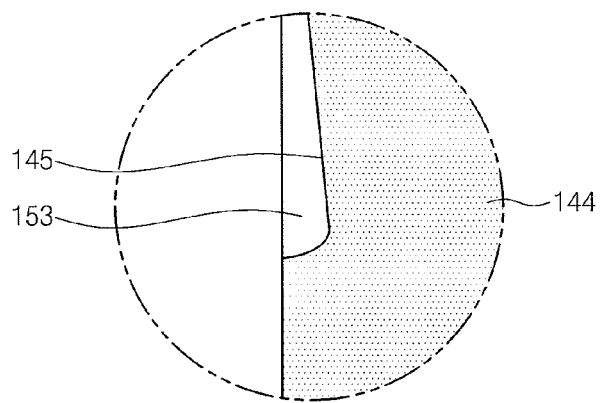
FIG. 2B is an expansion view of the B region in FIG. 2A.

FIG. 2A is a view illustrating a semiconductor device according to a modified embodiment of the inventive concept and FIG. 2B is an expansion view of the B region in FIG. 2A.

Referring to FIGS. 2A and 2B, the metal-containing pattern 134 may be disposed on the gate insulating pattern 112. The metal-containing pattern 134 has a sidewall coplanar with a sidewall of the gate pattern 112. The metal-containing pattern 134 may include conductive metal compound. For example, the metal-containing pattern may include oxide, nitride and/or oxynitride of one selected from Titanium, Tantalum, Tungsten, Molybdenum, Aluminum, Hafnium and Zirconium.

The gate pattern 144 may be disposed on the metal-containing pattern 134. In contrast to the embodiment shown in FIG. 1A, the gate pattern 144 of the modified embodiment has a recessed sidewall 145. The protective layer 153 may be disposed on the sidewall of the gate pattern 144 that includes the recessed sidewall 145. The protective layer 153 may include a plurality of protective particles that are attached non-uniformly on the recessed sidewall 145 of the gate pattern 144. In the modified embodiment, the size of the protective particles may not be uniform. The protective particles may be arranged non-uniformly on the sidewall of the gate pattern 144.

The thickness of the protective layer 153 may be non-uniform. For example, the lower portion of the protective layer 153 may be more than the upper portion of the protective layer 153 in the number of particles. Thus the lower portion of the protective layer 153 may be thicker than the upper portion of the protective layer 153. Alternatively, the thickness of the protective layer 153 may be varied in accordance with arrangement of the protective particles.

The protective particles included in the protective layer 153 may include oxide, nitride and/or oxynitride of the material that composes the gate pattern 144. For example, the protective particles may include oxide, nitride and/or oxynitride of poly semiconductor. In the embodiment of the inventive concept, the protective particles may include oxidized or nitrified semiconductor particles.

Figure 3A:
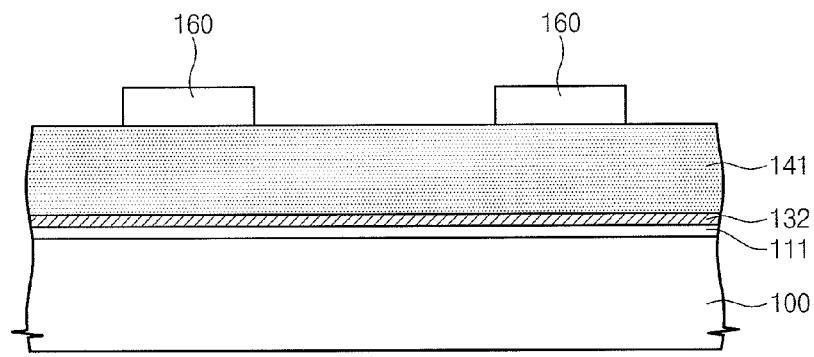
FIGS. 3A through 3C are sectional views illustrating a method for fabricating a semiconductor device according to an embodiment of the inventive concept.
Figure 3B:
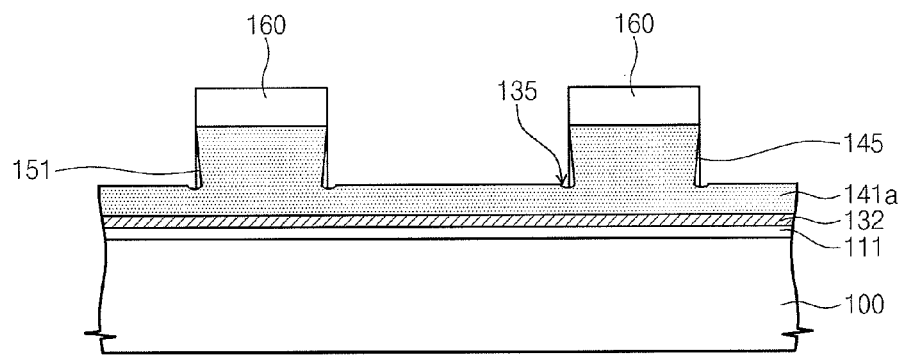
Figure 3C:
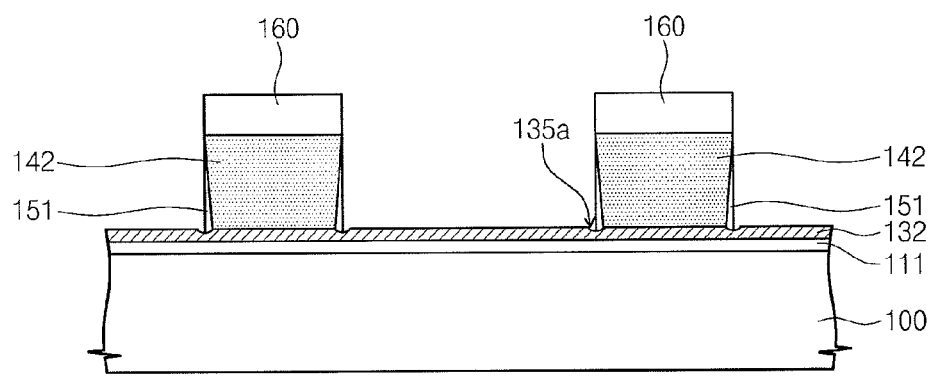

FIGS. 3A through 3C are sectional views illustrating a method for fabricating a semiconductor device according to an embodiment of the inventive concept.

Figure 7:
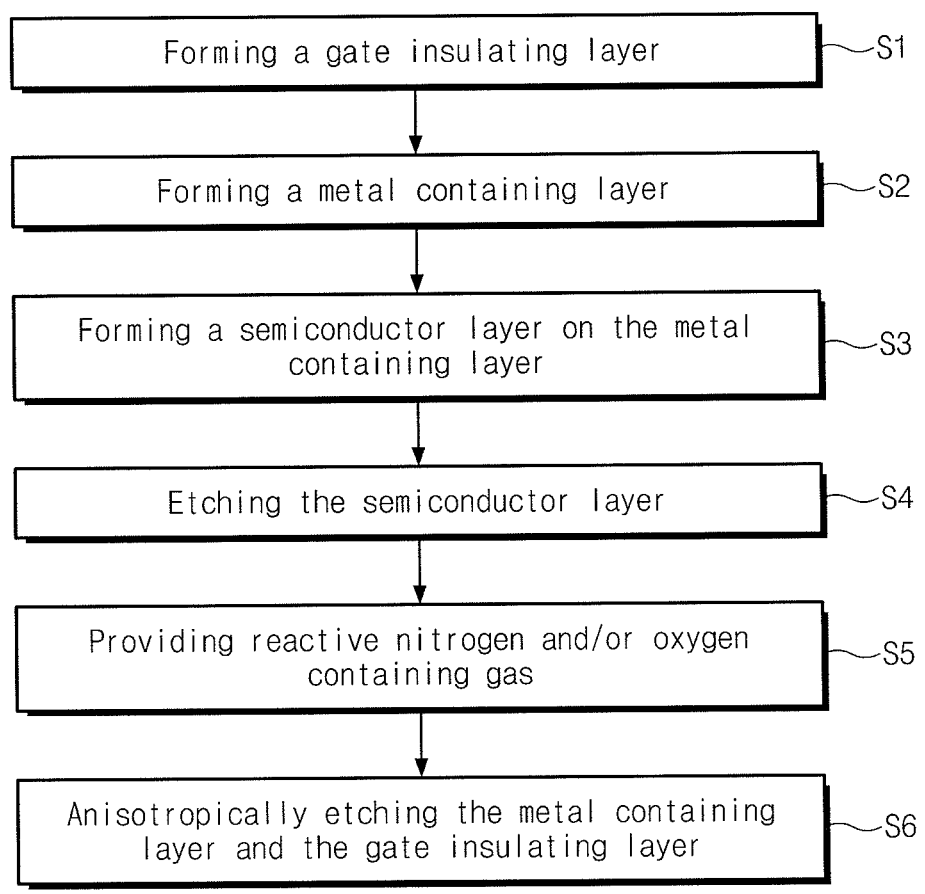
FIG. 7 is a flow chart illustrating a method for fabricating a semiconductor device according to embodiments of the inventive concept.

FIG. 7 is a flow chart illustrating a method for fabricating a semiconductor device according to embodiments of the inventive concept.

Referring to FIGS. 3A and 7, in step S1, a gate insulating layer 111 is formed on a semiconductor substrate 100. The semiconductor substrate may be doped with dopants so that a well region is formed in the semiconductor substrate prior to forming the gate insulating layer 111. The gate insulating layer 111 may include high-k dielectric layer. For example, the gate insulating layer 111 may include metal oxide, metal silicon oxide or metal silicon oxynitride containing at least one of Hafnium, Zirconium, Aluminum, Titanium, Lanthanum, Yttrium, Gadolinium and Tantalum. For example, the gate insulating layer 111 may include Hafnium Silicon Oxynitride (HfSiON).

In step S2, a metal-containing layer 132 may be formed on the gate insulating layer 111. The metal-containing layer 132 may include conductive metal compounds. The conductive metal compounds may include material that has different etching selectivity from the gate insulating layer 111. The metal-containing layer 132 may include at least one from a group consisting of Titanium, Tantalum, Tungsten, Molybdenum, Aluminum, Hafnium and Zirconium. For example, the metal-containing layer 132 may include TiN (Titanium Nitride).

In step S3, a semiconductor layer 141 is formed on the metal-containing layer 132. The semiconductor layer 141 may include polysilicon. The semiconductor layer 141 may be formed using any of various deposition methods, including a chemical vapor deposition (CVD) and an atomic layer deposition (ALD). For example, the semiconductor layer 141 may be formed in a low pressure chemical vapor deposition (LPCVD).

A mask pattern 160 may be formed on the semiconductor layer 141. The mask pattern 160 may cover a portion of the semiconductor layer 141.

Referring to FIGS. 3B, 3C and 7, in step S4, the semiconductor layer 141 is etched using the mask pattern 160 as an etch mask. FIG. 3B is a sectional view illustrating the semiconductor layer that is partially etched. FIG. 3C is a sectional view illustrating the semiconductor layer that is etched enough to form a gate pattern 142. The etching of the semiconductor layer 141 may be performed using an etchant that has high etch selectivity to the semiconductor layer 141. The semiconductor layer 141 may be etched with a gas containing a halogen element, for example, hydrogen bromide (HBr) gas.

The etching of the semiconductor layer 141 may include providing HBr gas at several through hundreds of standard cubic centimeters per minute (sccm) in an environment of dozens through thousands W (watt) of source power and back bias power. In one embodiment, the etching process may include providing at least one of oxygen and helium gas.

Particles of poly semiconductor may be produced as etching byproducts while the semiconductor layer 141 is being etched. Referring to FIG. 3B, a micro trench 135 may be forced at the upper surface of the semiconductor layer 141a that is partially etched. When the semiconductor layer 141 has been etched enough, metal-containing particles may be produced as etching byproducts which composed the metal-containing layer 132. A micro trench 135a may be then formed in the upper portion of the metal-containing layer 132. The etching byproducts may separate from the partially etched semiconductor layer 141a or the metal-containing layer 132 where the etchant collides. For example, the etching byproducts separate from the partially etched semiconductor layer 141a or the metal-containing layer 132 where the micro trenches 135 and 135a are formed.

In step S5, reactive nitrogen and/or oxygen-containing gas may be provided in a reaction chamber in which the semiconductor layer 141 is being etched. The reactive nitrogen and/or oxygen-containing gas may be provided during the etching process of the semiconductor layer 141. For example, the upper portion of the semiconductor layer 141 is etched, and then the lower portion of the semiconductor layer 141 is etched after providing the reactive nitrogen and/or oxygen-containing gas. Alternatively, the etching of the semiconductor layer 141 and the providing of the reactive nitrogen and/or oxygen-containing gas may be alternately performed. The reactive nitrogen and/or oxygen-containing gas may include an agent for nitrifying and/or oxidizing a component of the semiconductor layer 141 such as polysilicon. The reactive nitrogen and/or oxygen-containing gas may include at least one from a group consisting of $O_2$, $O_3$ and $N_2H_2$.

The reactive nitrogen and/or oxygen-containing gas may nitrify and/or oxidize the etching byproducts. For example, some particles of the poly semiconductor or the metal-containing particles may be nitrified and/or oxidized. The nitrified and/or oxidized particles may be attached on the sidewall of the partially etched semiconductor layer 141a. The particles attached on the sidewall of the partially etched semiconductor layer 141a are to be protective particles which protect the sidewall of the partially etched semiconductor layer 141a. The particles attached on the sidewall of the partially etched semiconductor layer 141a may compose a protective layer 151.

The etching byproducts may be produced at the region where the etchant and the partially etched semiconductor layer 141a are contacted. For example, the etching byproducts are produced at the micro trenches 135 and 135a. Thus the nitrified and/or oxidized etching byproducts may be more attached on a lower sidewall of the gate pattern 142 that is adjacent to the micro trenches 135 and 135a. In contrast, relatively fewer particles are attached on an upper sidewall of the gate pattern 142. Therefore, the protective layer 151 including the protective particles may have an upper portion thicker than a lower portion. Alternatively, the thickness and profile of the protective layer 151 may be controlled by injection time and/or injection period of the reactive nitrogen and/or oxygen-containing gas.

Compared with the semiconductor layer 141, the protective particles may have relatively lower etching rate to the etchant that is used for etching the semiconductor layer 141. For example, the protective particles may be lower etching selectivity than the poly semiconductor to the etchant used in the etching process.

In the anisotropic etching process, some etchant which is collided to a portion of the target layer may be reflected from the target, thereby etching another portion of the target layer. For example, some etchant which is collided to the semiconductor layer may be reflected to the sidewalls of the partially etched semiconductor layer 141a, thereby forming a negative profile of the gate pattern 142. However, in the embodiment of the inventive concept, the partially etched semiconductor layer 141a may be protected from undesired etching, because the protective layer 151 which has etching selectivity different from the etched semiconductor layer 141a is formed on the sidewall of the partially etched semiconductor layer 141a. That is, the negative profile may be minimized and thereby improving the characteristic of the gate pattern.

The protective layer 151 may be formed at various structures by injection period and/or injection time of the reactive nitrogen and/or oxygen-containing gas. For example, the protective layer 151 may be formed on an entire sidewall of the gate pattern 142 as shown in FIG. 1A, or be formed on a portion of sidewall as shown in FIG. 2A.

Referring to FIG. 1A, in step S6, the metal-containing layer 132 and the gate insulating layer 111 are etched using the mask pattern 160, the gate pattern 142 and the protective layer 151 as an etch mask. Damage caused by the etching process on the metal-containing layer 133 and the gate insulating layer 111 may be minimized by the protective layer 151 on the gate pattern 142. The gate pattern 142, in particular the lower portion of the gate pattern, may have negative profile, if the protective layer 151 may not be formed on the gate pattern 142. If the metal-containing layer 133 and the gate insulating layer 111 are etched using the gate pattern with negative profile as an etch mask, the metal-containing layer 133 and the gate insulating layer is formed to be self-aligned with the sidewall of the gate pattern 142, thereby characteristic of the metal-containing layer 133 and may be degraded. However, in the embodiment of the inventive concept, the sidewall of the gate pattern 142 may be protected, and sidewalls of the metal-containing layer 133 and the gate insulating layer 111 may be protected, which have been etched using the gate pattern 142 as an etch mask. Thus reliability of the semiconductor device can be improved.

Then, source/drain regions 102 are formed in the semiconductor substrate 100 using the gate pattern 142 as an implantation mask. The source/drain regions 102 may be formed by injecting dopants of a first conductivity type and a second conductivity type into the semiconductor substrate 100.

Figure 4A:
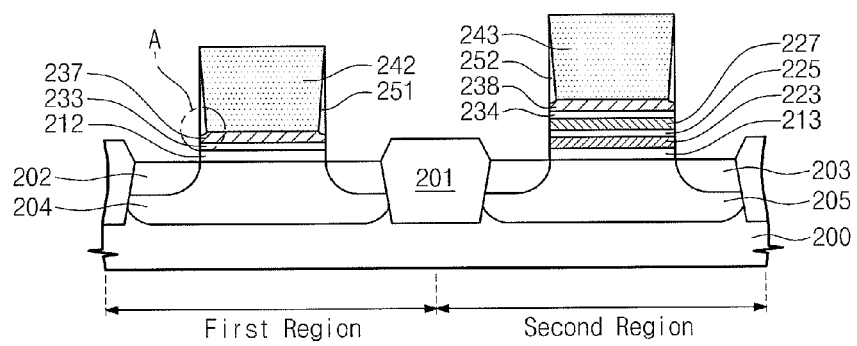
FIG. 4A is a view illustrating a semiconductor device according to another embodiment of the inventive concept.
Figure 4B:
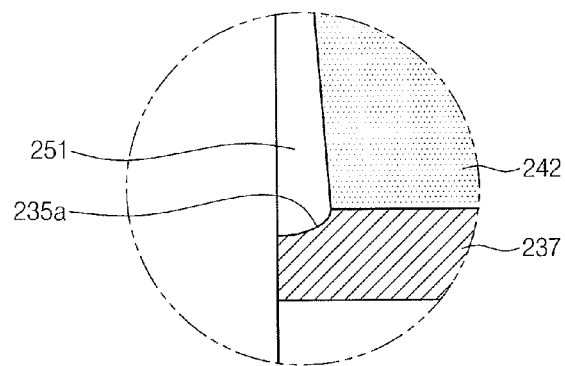
FIG. 4B is an expansion view of the A region in FIG. 4A.

FIG. 4A is a view illustrating a semiconductor device according to another embodiment of the inventive concept, and FIG. 4B is an expansion view of the A region in FIG. 4B.

Referring to FIGS. 4A and 4B, a semiconductor substrate 100 including a first region and a second region is provided. The first region and the second region are separated each other by a device isolation layer 201. A first well region 204 is formed in the first region of the semiconductor substrate 100, and a second well region 205 is formed in the second region of the semiconductor substrate 100. The first well region may be doped with dopants of a first conductivity type and the second well region may be doped with dopants of a second conductivity type opposite to the first conductivity type. First source/drain regions 202 doped with dopants of the second conductivity type may be disposed in the first well region 204, and second source/drain regions 203 doped with dopants of the first conductivity type are disposed in the second well region 205.

A first lower gate insulating pattern 212, a first upper gate insulating pattern 233, a first metal-containing pattern 237 and a first gate pattern 242 may be sequentially stacked on the semiconductor substrate 100 between the first source/drain regions 202.

The first lower gate insulating pattern 212 and the first upper gate insulating pattern 233 may include high-k dielectric layers. The first lower gate insulating layer 212 may include metal oxide, metal silicon oxide or metal silicon oxynitride which includes at least one metal of hafnium, zirconium, aluminum, titanium, lanthanum, yttrium, gadolinium or tantalum. For example, the first gate insulating pattern 212 may include hafnium silicon oxynitride (HfSiON). The first upper gate insulating pattern may include oxide of metal in lanthanum group. In contrast to FIG. 4A, one of the first lower gate insulating layer 212 and the first upper gate insulating pattern may be omitted.

The first metal-containing pattern 237 may include conductive metal compound. For example, the first metal-containing pattern 237 may be metal nitride including at least one of titanium, tantalum, tungsten, molybdenum, aluminum, hafnium and zirconium. For example, the first metal-containing pattern may include titanium nitride. The first metal-containing pattern may also have a depressed edge.

The first gate pattern 242 may have a sidewall sloped with respect to the surface of the semiconductor substrate 200. For example, the first gate pattern 242 may have the upper and lower parts that have different widths from each other, and the upper part may be narrower than the lower part. The first gate pattern 242 may include poly semiconductor. For example, the first gate pattern 242 may include polysilicon.

A first protective layer 251 may disposed on the sidewall of the first gate pattern 242. The first protective layer 251 may be extended to the depressed edge of the first metal-containing pattern 237. The first protective layer 251 may include protective particles. The protective particles may include oxide, nitride and/or oxynitride of poly semiconductor particle. The protective particles may further include oxide, nitride and/or oxynitride of material composing the first metal-containing pattern. The particles may be attached on the lower part of the first gate pattern 242 more than the upper part of the first gate pattern 242. Thus the lower part of the first protective layer 251 may be thicker than the upper part.

A second lower gate insulating pattern 213, the lower gate conductive pattern 223, a thin film pattern 225, an upper gate conductive pattern 227, a second upper gate insulating pattern 234, a second metal-containing pattern 238 and a second gate pattern 243 may be sequentially stacked on the semiconductor substrate 200 between the second source/drain regions 204. Alternatively, the lower gate conductive pattern 223 and the gate conductive pattern 227 may be directly contacted by omitting the thin film pattern 225.

The second lower gate insulating pattern 213 may include a high-k dielectric layer. The second lower gate insulating pattern 213 may include oxide, nitride, silicon oxide or silicon oxynitride including at least one of hafnium, zirconium, aluminum, titanium, tantalum, lanthanum, yttrium and gadolinium. For example, the second lower gate insulating pattern 213 may include hafnium silicon oxy-nitride.

The lower gate conductive pattern 223 and the upper gate conductive pattern 227 may include conductive metal compound. For example, the lower gate conductive pattern 223 and the upper gate conductive pattern 227 may be nitride including at least one of titanium, tantalum, tungsten, molybdenum, aluminum, hafnium and zirconium. The lower and the upper gate conductive patterns 223 and 227 may further include nonmetal impurities. The lower gate conductive pattern 223 may have different characteristic from the upper gate conductive pattern 227. For example, the lower gate conductive pattern 223 and the upper gate conductive pattern 227 may be different from each other in thickness. The lower gate conductive pattern 223 and the upper gate conductive pattern 227 are also different from each other in content rate of elements. The work function of the gate structure which includes the upper and lower gate conductive pattern 223 and 227 and the second gate pattern 243 may be controlled as a result of the upper gate conductive pattern 223 and the lower gate conductive pattern 224. For example, the gate conductive patterns 223 and 227 are selectively interposed between the second gate pattern 243 and the semiconductor substrate 200 while forming the first gate pattern 242 in the first region and the second gate pattern 243 in the second region with identical material. Thereby, the work function of the gate structure in the second region may be selectively controlled. Thus, transistors in the first region and second region may have different threshold voltage.

The thin film pattern 225 may be interposed between the lower gate conductive pattern 223 and the upper gate conductive pattern 227. The thin film pattern 225 may include oxide of lanthanum group element. The thin film pattern 225 may be thinner than the lower gate conductive pattern 223 and the upper gate conductive pattern 227. For example, the lower gate conductive pattern 223 and the upper gate conductive pattern 227 may have thickness of dozens of angstroms Å, and the thin film pattern 225 may have thickness of several Å. Alternatively, the thin film pattern 225 may be omitted.

The second upper gate insulating pattern 234 may include a high-k dielectric layer. The second upper gate insulating pattern 234 may include an oxide of lanthanum group metal.

The second metal-containing pattern 238 may include conductive metal compound. For example, the second metal-containing pattern 238 may be nitride of metal including at least one of titanium, tantalum, tungsten, molybdenum, aluminum, hafnium and zirconium. For example, the second metal-containing pattern 238 may include titanium nitride. The second metal-containing pattern 238 may include material substantially identical with the first metal-containing pattern 237. The second metal-containing pattern 238 may have a depressed edge 235*a*.

The second gate pattern 243 may have a sidewall that is sloped with respect to the surface of the semiconductor substrate 200. For example, the second gate pattern 243 has an upper part and a lower part that are different in width, wherein the upper part is narrower than the lower part. In the difference of the uppermost width and lowest width, the second gate pattern 243 is smaller than the first gate pattern 242. Thus the sidewall of the second gate pattern 243 is less sloped than the sidewall of the first gate pattern 242 with respect to the surface of the semiconductor substrate 200.

A second protective layer 252 may be disposed on a sidewall of the second gate pattern 243. The second protective layer 252 may extend to the depressed edge 235*a*. The second protective layer 252 may include protective particles. For example, the protective particles may include oxide, nitride and/or oxynitride of poly semiconductor particles. The protective particles may further include oxide, nitride and/or oxynitride of material composing the second metal-containing pattern 238. The lower part of the second gate pattern 243 has more particles than the upper part of the second gate pattern 243. Thus a lower part of the second protective layer 252 may be thicker than an upper part. The second protective layer 252 may have a different thickness than the first protective layer 251.

The shapes of the first and second gate pattern 242 and 243, and the first and second protective layers 251 and 252 may be modified.

Figure 5A:
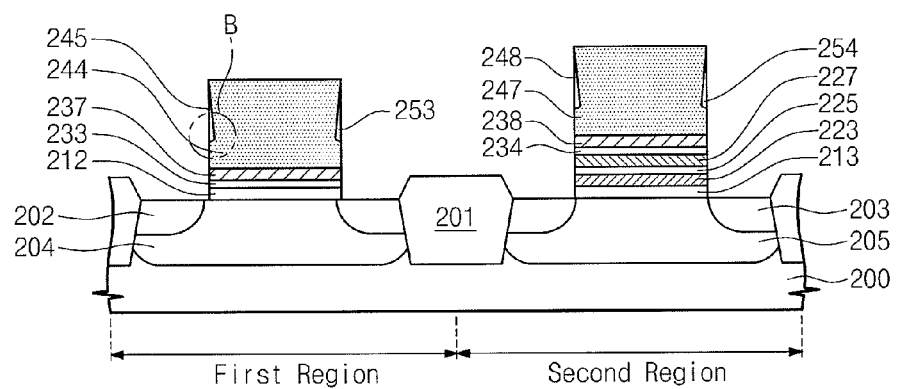
FIG. 5A is a view illustrating a semiconductor device according to another modified embodiment of the inventive concept.
Figure 5B:
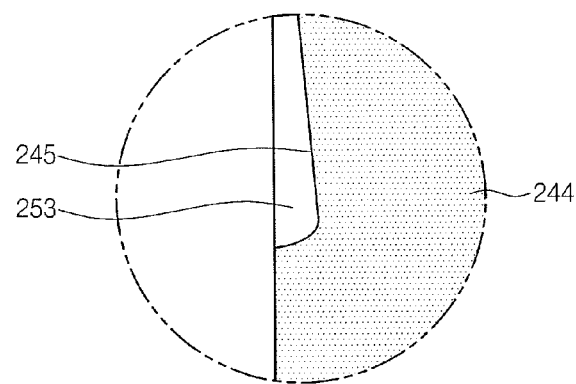
FIG. 5B is an expansion view of the B region in FIG. 5A.

Referring to FIGS. 5A and 5B, the sidewalls of the first gate pattern 244 and the second gate pattern 247 may have a first recess 245 and a second recess 248, respectively. The first and the second recesses 245 and 248 may not be disposed on edges of the sidewalls but on the center of the sidewalls of the first gate pattern 244 and the second gate pattern 247. The first protective layer 253 and the second protective layer 254 may be disposed on the recesses 245 and 248. The first protective layer 253 and the second protective layer 254 may include protective particles. The protective particles may include at least one of materials composing the first and the second gate pattern 244 and 247. The first and the second protective layer 253 and 254 may include protective particles substantially identical with the first and the second protective layers 251 and 252 that have been described in connection with FIG. 4A.

With reference to FIGS. 4A, 4B, 6A through 6D and 7, a method of fabricating a semiconductor device according to another embodiment of the inventive concept is now described.

Figure 6A:
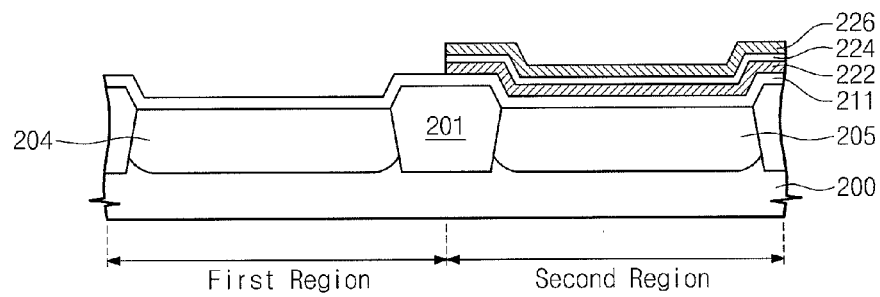
FIGS. 6A through 6D are sectional views illustrating a method for fabricating a semiconductor device according to another embodiment of the inventive concept.

Referring to FIGS. 6A and 7, a device isolation layer 201 may be formed on the semiconductor substrate 200. The device isolation layer 201 may separate a first region and a second region. A first well region 204 and a second well region 205 may be formed in the semiconductor substrate 200. The first well region 204 and the second well region 205 may be doped with dopants of different conductivity. For example, the first well region 204 and the second well region 205 may be doped with p-type conductivity and n-type conductivity, respectively.

In step S1, a lower gate insulating layer 211 may be formed on the semiconductor substrate 200. The lower gate insulating layer 211 may be formed on the entire surface of the semiconductor substrate 200 in the first and second regions. The lower gate insulating layer 211 may include a high-k dielectric layer. For example, the lower gate insulating layer 211 may include hafnium silicon oxy-nitride. The lower gate insulating layer 211 may be formed in at least one of various deposition process such as atomic layer deposition (ALD) process and chemical vapor deposition (CVD) process.

A lower gate conductive layer 222, a thin film layer 224 and an upper gate conductive layer 226 may be selectively formed on the semiconductor substrate 200 in the second region. The lower gate conductive layer 222, the thin film layer 224 and the upper gate conductive layer 226 may be formed by sequentially forming a conductive layer, a high-k dielectric layer and a conductive layer and selectively removing the layers on the semiconductor substrate 200.

Figure 6B:
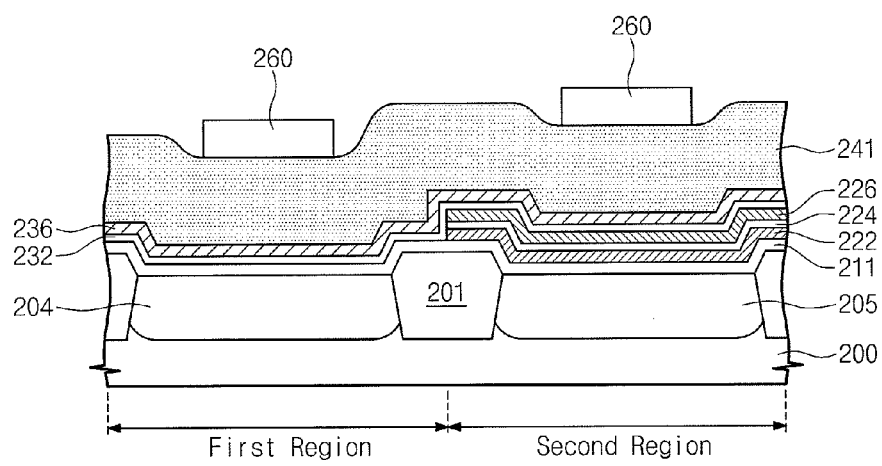

Referring to FIG. 6B, an upper gate insulating layer 232 may be formed on the semiconductor substrate 200. The upper gate insulating layer 232 may be formed on the semiconductor substrate 200 in the first region and the second region, and the lower gate insulating layer 211. The upper gate insulating layer 232 may be a high-k dielectric layer. For example, the upper gate insulating layer 232 may include oxide, nitride and/or oxynitride of at least one of lanthanum group metals.

In step S2, a metal-containing layer 236 is formed on the upper gate insulating layer 232. The metal-containing layer 236 may be formed on the upper gate insulating layer 232 in the first and second regions. The metal-containing layer 236 may include conductive metal compound. For example, the metal-containing layer 236 may include metal nitride.

In step S3, a semiconductor layer 241 may be formed on the metal-containing layer 236. The semiconductor layer 241 may include poly semiconductor. The semiconductor layer 241 may be dozens through several hundreds times as thick as the upper and the lower gate conductive layer 222 and 226.

Mask patterns 260 are formed on the semiconductor layer 241. The mask patterns 260 may be formed on the semiconductor substrate 200 in the first well region 204 and the second well region 205.

Figure 6C:
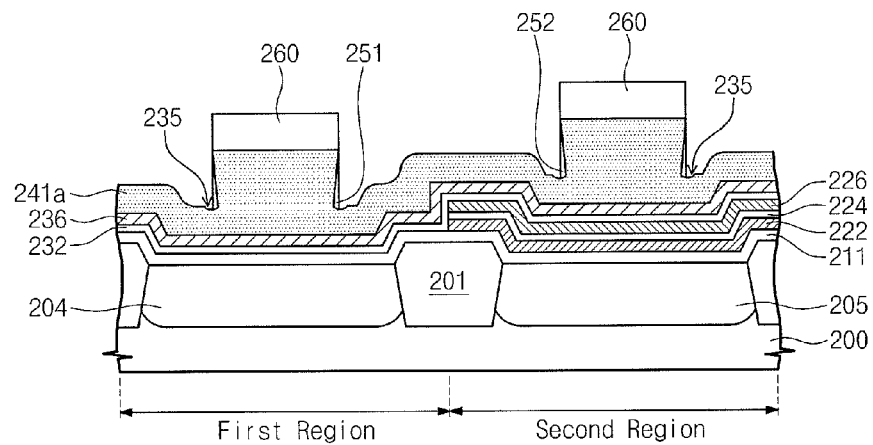
Figure 6D:
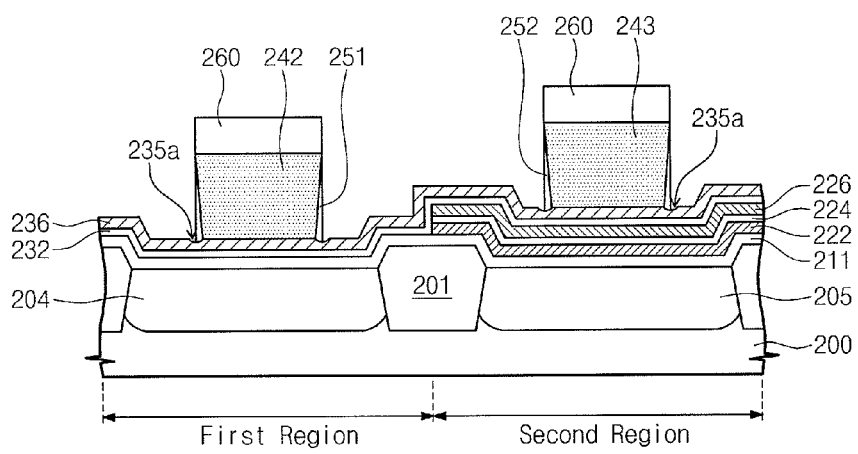

Referring to FIGS. 6C and 6D, in step S4, the semiconductor layer 241 may be etched in an anisotropic etching process. FIG. 6C shows a partially etched semiconductor layer 241a, and FIG. 6D shows a semiconductor layer that has been etched enough for gate patterns 242 and 243. The etching of the semiconductor layer 241 is conducted using a halogen based etchant, for example, HBr. The etching of the semiconductor layer 241 may produce particles that have composed the semiconductor layer 241, such as poly semiconductor particles. The poly semiconductor particles are produced in the region where the etchant is in contact with the partially etched semiconductor layer 241a. For example, the poly semiconductor particles may be produced at micro trenches 235 adjacent to the etched sidewall of the partially etched semiconductor layer 241a. If the semiconductor layer 241 is etched enough to form gate patterns 242 and 243 as shown in FIG. 6B, a portion of the metal-containing layer 236 may be etched to form micro trenches 235a on the metal-containing layer 236.

In step S5, reactive nitrogen and/or oxygen-containing gas may be provided in the anisotropic etching process. The reactive nitrogen and/or oxygen-containing gas may nitrify and/or oxidize the poly semiconductor particles that are produced in the etching of the semiconductor layer 241. The nitrified and/or oxidized particles (hereinafter, protective particle(s)) may attached on the partially etched semiconductor layer 241a, thereby forming protective layers 251 and 252 on the sidewall of the partially etched semiconductor layer 241a. If the semiconductor layer 241 is etched enough, metal-containing particles may be produced as byproducts in an etching of the metal-containing layer 236 to be nitrified and/or oxidized by the reactive nitrogen and/or oxygen-containing gas.

The protective layers 251 and 253 may have various structures in accordance with an injection period and/or an injection time of the reactive nitrogen and/or oxygen-containing gas. For example, the protective layers 251 and 253 may be fanned on the entire sidewalls of the gate patterns 242 and 243 as shown in FIG. 4A. Alternatively, the protective layers 251 and 253 may be formed on a portion of the sidewall of the gate patterns 242 and 243. The thickness of the protective layer 251 and 253 may also depend on the injection period and/or the injection time of the reactive nitrogen and/or oxygen-containing gas. For example, if the reactive nitrogen and/or oxygen-containing gas is injected after etching the semiconductor layer 241 sufficiently, the protective layer may be relatively thicker on a lower sidewall of the gate patterns 242 and 243 while being relatively thinner on an upper sidewall of the gate patterns 242 and 243.

The protective particles may be lower than the semiconductor layer 241 in an etch selectivity with respect to the etchant. Thus, damages of the sidewalls of the partially etched semiconductor layer 241a and the gate patterns 242, 243 may be reduced.

Referring to FIG. 4A, in step S6, the metal-containing layer 236 and the upper gate insulating layer may be etched using the mask patterns 260 and the gate patterns 242 and 243 as an etch mask to form a first upper gate insulating pattern 233 and a first metal-containing pattern 237 on the semiconductor substrate 200 in the first region and a second upper gate insulating pattern 233 and a second metal-containing pattern 238 on the semiconductor substrate 200 in the second region.

Subsequently, the upper gate conductive layer 226, the thin film layer 224 and the lower gate conductive layer 222 may be sequentially etched. If the first and the second protective layers 251 and 252 are not formed on the first and the second gate patterns 242 and 243, characteristics of the first gate pattern 242 in the first region would be degraded in the etching the upper gate conductive layer 226, the thin film layer 224 and the lower gate conductive layer 222 in the second region. Specifically, there is no layer to be etched while the gate conductive layers 226 and 222 are etched in the second region. Therefore, the sidewall of the first gate pattern 242 may be damaged by chemical and/or physical reaction of the etchant that is used in the etching of the gate conductive layers 226 and 222, whereby the profile of the first gate pattern 242 may be more negative. In embodiments of the inventive concept, however, the sidewall of the first gate pattern 242 may be prevented from damage in the etching of the layers in the second region because the first protective layer 251 is formed on the sidewall of the first gate pattern 242. Therefore, the first gate pattern 242 may have a relatively vertical profile.

Referring to FIGS. 4A and 4B, first and second source/drain regions 202 and 203 may be formed in the semiconductor substrate adjacent to the gate patterns 242 and 243. The first and the second source/drain regions may be formed in ion implantation process using the mask pattern 260 and the gate patterns 242 and 243 as an ion implantation mask. The mask pattern 260 may be removed.

According to embodiments of the inventive concept, reactive nitrogen and/or oxygen-containing gas may be provided in anisotropic etching of a semiconductor layer or after anisotropic etching of the semiconductor layer. The providing of the reactive nitrogen and/or oxygen-containing gas may prevent the semiconductor layer from being damaged. Therefore, a semiconductor device with minimized etching damage may be fabricated while improving reliability of the semiconductor device.

The above-described subject matter is to be considered illustrative and not restrictive, and the appended claims are intended to cover all modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:
1. A semiconductor device comprising:
a semiconductor substrate;
a high-k dielectric pattern and a metal-containing pattern sequentially stacked on the semiconductor substrate;
a gate pattern including poly semiconductor disposed on the metal-containing pattern; and
a protective layer disposed on a sidewall of the gate pattern and spaced apart from the high-k dielectric pattern,
wherein the protective layer includes oxide, nitride and/or oxynitride of the poly semiconductor,
wherein the protective layer has a gradually narrowing width from the bottom of the gate pattern to the top of the gate pattern, and wherein an edge of the metal-containing pattern is depressed relative to a top surface of the metal-containing pattern to form a micro trench in the metal-containing pattern.

2. The device of claim 1, wherein the protective layer covers at least a portion of the sidewall of the gate pattern.

3. The device of claim 1, wherein the protective layer includes oxidized and/or nitrified particles of the poly semiconductor.

4. The device of claim 3, wherein the particles of the poly semiconductor are disposed non-uniformly on the sidewall of the gate pattern.

5. The device of claim 1, wherein the protective layer has non-uniform thickness.

6. The device of claim 1, wherein the semiconductor substrate includes a first region and a second region, and the device comprises:
    a first transistor formed in the first region and a second transistor formed in the second region;
    the high-k dielectric layer pattern, the metal-containing pattern and the gate pattern are disposed on the first region forming part of the first transistor and the second region forming part of the second transistor; and
    a gate conductive pattern is selectively interposed between the high-k dielectric pattern and the metal-containing pattern on the second region as part of the second transistor.

7. The device of claim 6, wherein the first and second regions of the semiconductor substrate include a first well region of a first conductivity and a second well region of a second conductivity, respectively.

8. The device of claim 1, wherein the protective layer further includes nitride, oxide and/or oxynitride of byproducts of the metal-containing pattern.

9. The device of claim 1, wherein at least a portion of sidewalls of the gate pattern is at an obtuse angle with respect to the bottom of the gate pattern.

10. The device of claim 1, wherein at least a portion of the gate pattern has a tapered width that decreases from a top of the gate pattern toward the substrate.

11. The device of claim 10, wherein the gate pattern is tapered from the top of the gate pattern to the metal containing layer.

12. The device of claim 10, wherein the gate pattern is tapered from the top of the gate pattern to a middle portion of the gate pattern.

* * * * *